United States Patent
Yuan et al.

(10) Patent No.: US 11,296,169 B2
(45) Date of Patent: Apr. 5, 2022

(54) ARRAY SUBSTRATE, DISPLAY PANEL, AND DISPLAY DEVICE EACH HAVING IMPROVED RESOLUTION

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/883,001

(22) Filed: May 26, 2020

(65) Prior Publication Data
US 2021/0005692 A1    Jan. 7, 2021

(30) Foreign Application Priority Data
Jul. 2, 2019   (CN) ......................... 201910590944.1

(51) Int. Cl.
 H01L 29/08    (2006.01)
 H01L 27/32    (2006.01)
 G09G 3/3266   (2016.01)

(52) U.S. Cl.
 CPC ....... *H01L 27/3262* (2013.01); *G09G 3/3266* (2013.01); *H01L 27/3211* (2013.01); *H01L 27/3265* (2013.01); *H01L 27/3276* (2013.01)

(58) Field of Classification Search
 CPC ............. H01L 27/3262; H01L 27/3211; H01L 27/3265; G09G 3/3266
 See application file for complete search history.

(56) References Cited

U.S. PATENT DOCUMENTS

| 2019/0097154 A1* | 3/2019 | Xu ...................... H01L 51/5237 |
| 2020/0020277 A1* | 1/2020 | Lee ..................... H01L 51/5206 |
| 2020/0075880 A1* | 3/2020 | Wen .................... H01L 27/3283 |

FOREIGN PATENT DOCUMENTS

| CN | 102543016 A | 7/2012 |
| CN | 103578411 A | 2/2014 |

(Continued)

OTHER PUBLICATIONS

First Office Action dated May 28, 2020 for application No. CN201910590944.1 with English translation attached.

*Primary Examiner* — Phuc T Dang
(74) *Attorney, Agent, or Firm* — Nath, Goldberg & Meyer; Joshua B. Goldberg

(57) ABSTRACT

An array substrate, a display panel and a display device are provided. The array substrate includes a plurality of pixel units arranged in an array, each pixel unit includes a first sub-pixel, a second sub-pixel and a third sub-pixel, and each of the first, second and third sub-pixels includes a pixel circuit including a switching transistor, a driving transistor, a sensing transistor, a storage capacitor and a light-emitting device. The first sub-pixels, the second sub-pixels and the third sub-pixels included in each row of the array are controlled by four scanning lines, and at least one of the four scanning lines is shared by the row of the array and another row of the array adjacent to the row of the array. Each column of pixel units of the array are coupled to a same data line.

20 Claims, 2 Drawing Sheets

(56) References Cited

FOREIGN PATENT DOCUMENTS

| | | |
|---|---|---|
| CN | 103778888 A | 5/2014 |
| CN | 108957882 A | 12/2018 |
| CN | 109166529 A | 1/2019 |
| CN | 109698225 A | 4/2019 |
| CN | 109935212 A | 6/2019 |
| EP | 2 390 869 A3 | 3/2011 |
| WO | 2019000914 A1 | 1/2019 |

* cited by examiner

ARRAY SUBSTRATE, DISPLAY PANEL, AND DISPLAY DEVICE EACH HAVING IMPROVED RESOLUTION

CROSS-REFERENCE TO RELATED APPLICATION

The present disclosure claims priority of the Chinese patent application No. 201910590944.1 filed on Jul. 2, 2019, entitled "ARRAY SUBSTRATE, DISPLAY PANEL, AND DISPLAY DEVICE", the entire contents of which are incorporated herein by reference.

TECHNICAL FIELD

The present disclosure relates to the technical field of display, and particularly relates to an array substrate, a display panel and a display device.

BACKGROUND

Compared with a conventional liquid crystal display panel, an Active Matrix Organic Light Emitting Diode (AMOLED) display panel has advantages such as high response speed, high contrast, wide viewing angle and the like.

Currently, there are few display devices with 8K resolution using AMOLED display panel, mainly due to difficulty of manufacturing process (e.g., limited pixel arrangement space) and high manufacturing cost.

SUMMARY

An aspect of the present disclosure provides an array substrate including a plurality of pixel units arranged in an array, each of the plurality of pixel units including a first sub-pixel, a second sub-pixel and a third sub-pixel, each of the first sub-pixel, the second sub-pixel and the third sub-pixel including a pixel circuit which includes a switching transistor, a driving transistor, a sensing transistor, a storage capacitor and a light-emitting device. The first sub-pixels, the second sub-pixels and the third sub-pixels included in each row of pixel units of the plurality of pixel units are controlled by four scanning lines, and at least one of the four scanning lines is shared by the row of pixel units and another row of pixel units adjacent to the row of pixel units. Each column of pixel units of the plurality of pixel units are coupled to a same data line.

In an embodiment, the first sub-pixels, the second sub-pixels and the third sub-pixels included in an $N^{th}$ row of pixel units of the plurality of pixel units are respectively controlled by scanning lines $G_{1\_N}$, $G_{2\_N}$, $G_{3\_N}$ and $G_{1\_N+1}$, where N is an integer greater than or equal to 2; gates of the switching transistors of the first sub-pixels of the $N^{th}$ row of pixel units and gates of the sensing transistors of the third sub-pixels of an $N-1^{th}$ row of pixel units are coupled to the scanning line $G_{1\_N}$; gates of the switching transistors of the second sub-pixels of the $N^{th}$ row of pixel units and gates of the sensing transistors of the first sub-pixels of the $N^{th}$ row of pixel units are coupled to the scanning line $G_{2\_N}$; gates of the switching transistors of the third sub-pixels of the $N^{th}$ row of pixel units and gates of the sensing transistors of the second sub-pixels of the $N^{th}$ row of pixel units are coupled to the scanning line $G_{3\_N}$; and gates of the sensing transistors of the third sub-pixels of the $N^{th}$ row of pixel units and gates of the switching transistors of the first sub-pixels of an $N+1^{th}$ row of pixel units are coupled to the scanning line $G_{1\_N+1}$.

In an embodiment, in each pixel unit, the first and second sub-pixels are located in a same row, and the first and third sub-pixels are located in a same column.

In an embodiment, first electrodes of the sensing transistors of the second sub-pixels of an $M^{th}$ column of pixel units and first electrodes of the sensing transistors of the first and third sub-pixels of an $M+1^{th}$ column of pixel units are coupled to a same sensing line, where M is an integer greater than or equal to 1.

In an embodiment, first electrodes of the sensing transistors of the first and third sub-pixels of an $M^{th}$ column of pixel units and first electrodes of the sensing transistors of the second sub-pixels of the $M^{th}$ column of pixel units are respectively coupled to two separate sensing lines, where M is an integer greater than or equal to 1; and in each pixel circuit, a second electrode of the switching transistor is coupled to a gate of the driving transistor and a first terminal of the storage capacitor, a first electrode of the driving transistor is coupled to a first power supply voltage terminal, a second electrode of the driving transistor is coupled to a second terminal of the storage capacitor and a first electrode of the light-emitting device, a second electrode of the sensing transistor is coupled to the second terminal of the storage capacitor and the first electrode of the light-emitting device, and a second electrode of the light-emitting device is coupled to a second power supply voltage terminal.

In an embodiment, in each pixel unit, the first sub-pixel comprises a light-emitting device emitting red light, the second sub-pixel comprises a light-emitting device emitting green light, and the third sub-pixel comprises a light-emitting device emitting blue light.

In an embodiment, the light-emitting device comprises an organic electroluminescence device.

In an embodiment, the organic electroluminescent device comprises a top-emitting organic electroluminescence device.

In an embodiment, a first electrode of the organic electroluminescence device is an anode, a second electrode of the organic electroluminescence device is a cathode, and the cathodes of all of the organic electroluminescence devices of the array substrate are integral.

Another aspect of the present disclosure provides a display panel including the array substrate according to any one of the above embodiments of the present disclosure.

Another aspect of the present disclosure provides a display device including the display panel according to the above-described embodiment of the present disclosure.

DETAILED DESCRIPTION

Figure 1:
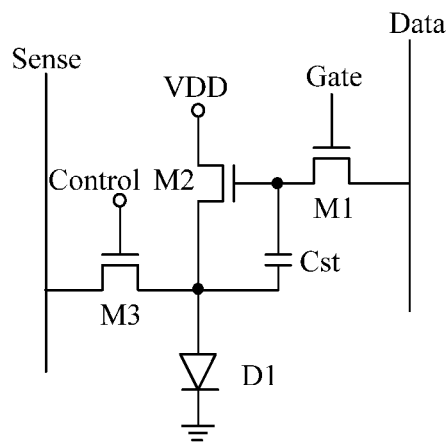
FIG. 1 is a schematic diagram illustrating a structure of a pixel circuit of one sub-pixel of each pixel unit in an array substrate according to an embodiment of the present disclosure.

In order to enable one of ordinary skill in the art to better understand technical solutions of the present disclosure, the present disclosure will be further described in detail below with reference to accompanying drawings and exemplary embodiments.

A transistor used in embodiments of the present disclosure may be a thin film transistor or a field effect transistor. Since a source and a drain of the transistor may be interchanged under certain conditions, the source and the drain of the transistor are not different from each other when describing coupling relationship thereof. In an embodiment of the present disclosure, in order to distinguish the source and the drain of the transistor from each other, one of the source and the drain of the transistor may be referred to as a first electrode of the transistor, and the other of the source and the drain of the transistor may be referred to as a second electrode of the transistor. Further, a gate of the transistor may be referred to as a control electrode of the transistor. In addition, the transistor may be an N-type transistor or a P-type transistor according to characteristic of the transistor, and the following non-limiting embodiments are described by taking an N-type transistor as an example. When an N-type transistor is used, the first electrode of the transistor may be a source of the N-type transistor, the second electrode of the transistor may be a drain of the N-type transistor, and the source and drain electrodes of the N-type transistor are electrically coupled to each other when a high level is inputted to a gate of the N-type transistor. The arrangement of the P-type transistor is opposite to that of the N-type transistor. It is conceivable that implementing the present disclosure with the P-type transistor (or a combination of the N-type transistor and the P-type transistor) is easily conceivable by one of ordinary skill in the art without inventive efforts, and therefore is also within the protection scope of the present disclosure.

In an embodiment of the present disclosure, a light-emitting device may be an organic electroluminescence device (or organic light-emitting device) in which one of first and second electrodes of the light-emitting device is an anode and the other is a cathode. The following non-limiting embodiments are described by taking the first electrode of the light-emitting device being the anode and the second electrode of the light-emitting device being the cathode as an example.

Unless otherwise defined, technical or scientific terms used in the embodiments of the present disclosure should have an ordinary meaning as understood by one of ordinary skill in the art to which the present disclosure belongs. The use of "first", "second", and similar terms in the embodiments of the present disclosure is not intended to indicate any order, quantity, or importance, but is intended to distinguish an element or part from another element or part. The word "include", "comprise", or the like, means that an element or part appearing before the word covers an element or part appearing after the word, and it is not excluded that the element or part appearing before the word further includes other elements or parts. A term such as "coupled" or "connected" is not limited to including physical or mechanical coupling, and may include direct or indirect electrical coupling and the like. Terms such as "upper", "lower", "left", "right", and the like are merely intended to indicate relative positional relationships, and when an absolute position of a described object is changed, the relative positional relationships may also be changed accordingly.

FIG. 1 illustrates a schematic diagram illustrating a structure of a pixel circuit of one sub-pixel of each pixel unit in an array substrate according to an embodiment of the present disclosure.

The array substrate includes a plurality of pixel units arranged in an array (i.e., in rows and columns), and each pixel unit may include a first sub-pixel, a second sub-pixel, and a third sub-pixel which have a same structure. As shown in FIG. 1, each sub-pixel includes a pixel circuit including a switching transistor, a driving transistor, a sensing transistor, a storage capacitor, and a light-emitting device. As shown in FIG. 1, in the pixel circuit of each sub-pixel, a gate of the switching transistor M1 is coupled to a scanning line Gate, a source of the switching transistor M1 is coupled to a data line Data, and a drain of the switching transistor M1 is coupled to a gate of the driving transistor M2 and a first terminal of the storage capacitor Cst. A source of the driving transistor M2 is coupled to a first power supply voltage terminal VDD, and a drain of the driving transistor M2 is coupled to a second terminal of the storage capacitor Cst and an anode of the light-emitting device D. A source of the sensing transistor M3 is coupled to a sensing line Sense, a drain of the sensing transistor M3 is coupled to the second terminal of the storage capacitor Cst and the anode of the light-emitting device D1, and a gate of the sensing transistor M3 is coupled to a sensing control terminal Control. A cathode of the light-emitting device D1 is coupled to a second power supply voltage terminal VSS (e.g., a ground voltage terminal shown at the lowermost part of FIG. 1). The three sub-pixels (i.e., the first sub-pixel, the second sub-pixel, and the third sub-pixel) may be distinguished from each other in that the light-emitting devices in the three sub-pixels emit light of different colors. In some cases, the light-emitting device in the first sub-pixel emits red light, that is, the first sub-pixel is a red sub-pixel; the light-emitting device in the second sub-pixel emits green light, that is, the second sub-pixel is a green sub-pixel; and the light-emitting device in the third sub-pixel emits blue light, that is, the third sub-pixel is a blue sub-pixel.

Generally, the three sub-pixels in each pixel unit are arranged in two rows and two columns (e.g., adjacent two rows and adjacent two columns). For example, the red and green sub-pixels are in a same row, and the red and blue sub-pixels are in a same column.

Conventionally, the sub-pixels emitting light of different colors in each column of pixel units require different data lines to be provided with data voltage signals. That is, the first sub-pixels, the second sub-pixels, and the third sub-pixels in each column of pixel units each require one separate data line to be provided with data voltage signals. In other words, three data lines are required for each column of pixel units to provide data voltage signals. This results in a large number of signal lines arranged in a display panel including an array substrate, making it difficult to improve the resolution of the display panel.

Therefore, the embodiments of the present disclosure provide an array substrate which improves the routing of the data lines in the array substrate in which the three sub-pixels in each pixel unit are arranged in two rows and two columns and three data lines are required for each column of pixel units. The array substrate according to the embodiments of the present disclosure may improve the resolution of a display panel including the array substrate according to the embodiments of the present disclosure. Meanwhile, it should be understood that the three sub-pixels in each pixel unit according to the embodiments of the present disclosure are not limited to the above arrangement.

The structure of each pixel unit in the array substrate according to the embodiments of the present disclosure will be further explained below with reference to the accompanying drawings.

Figure 2:
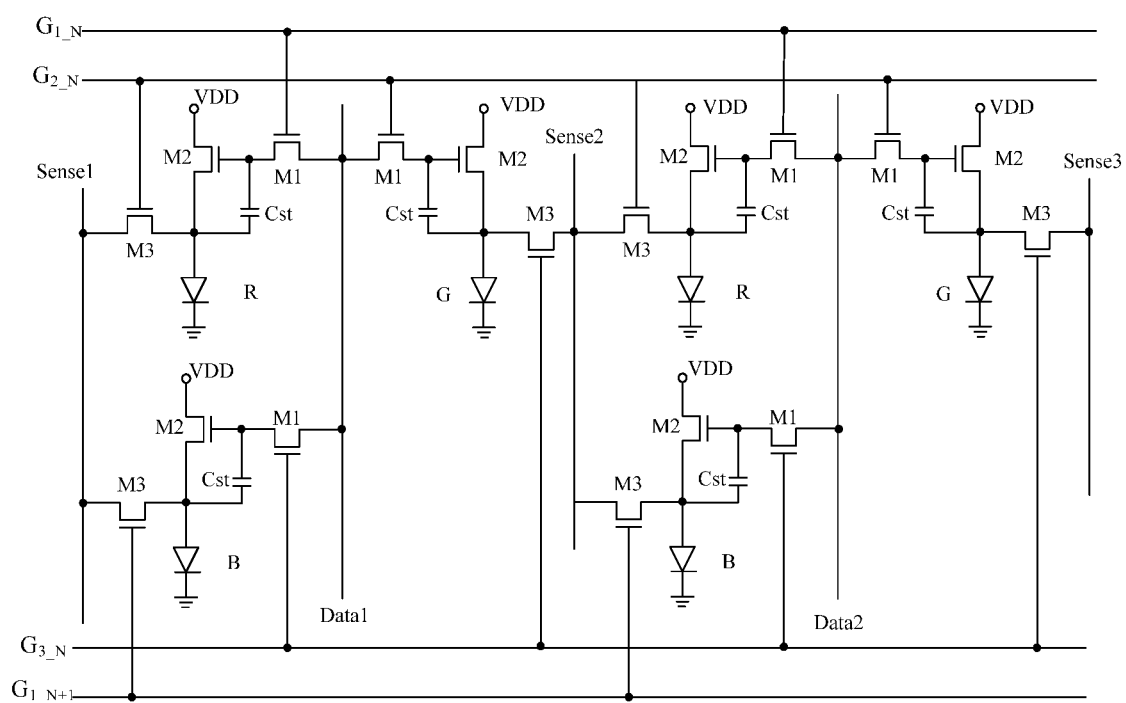
FIG. 2 is a schematic partial structure diagram of an array substrate according to an embodiment of the present disclosure.

FIG. 2 illustrates a schematic diagram illustrating a partial structure of an array substrate according to an embodiment of the present disclosure. As shown in FIG. 2, two pixel units in the array substrate including a plurality of pixel units arranged in an array (i.e., arranged in rows and columns) according to an embodiment of the present disclosure are shown, and the two pixel units may be in two adjacent columns of pixel units in a same row of pixel units.

As shown in FIG. 2, the three sub-pixels (i.e., the first sub-pixel, the second sub-pixel, and the third sub-pixel) in each pixel unit are arranged in two rows and two columns. For example, the first sub-pixel and the second sub-pixel are in a same row, and the first sub-pixel and the third sub-pixel are in a same column. The light-emitting devices in the three sub-pixels emit light of different colors. In a non-limiting example as shown in FIG. 2, a red sub-pixel (e.g., the first sub-pixel) including a light-emitting device R that can emit red light and a green sub-pixel (e.g., the second sub-pixel) including a light-emitting device G that can emit green light are in the same row, and the red sub-pixel and a blue sub-pixel (e.g., the third sub-pixel) including a light-emitting device B that can emit blue light are in the same column. In other words, in the embodiments of the present disclosure, the light-emitting device in the first sub-pixel emits red light (i.e., the first sub-pixel is the red sub-pixel), the light-emitting device in the second sub-pixel emits green light (i.e., the second sub-pixel is the green sub-pixel), and the light-emitting device in the third sub-pixel emits blue light (i.e., the third sub-pixel is the blue sub-pixel). However, the present disclosure is not limited thereto.

As shown in FIG. 2, each of the red, green, and blue sub-pixels (R, G and B may be used to refer thereto, respectively, in a case without confusion) includes a pixel circuit including at least a switching transistor M1, a driving transistor M2, a sensing transistor M3, a storage capacitor Cst, and a light-emitting device. The structure of each pixel circuit is substantially the same as that of the pixel circuit shown in FIG. 1. It should be understood that in the pixel circuits of the red, green and blue sub-pixels, remaining devices are substantially the same except that the light-emitting devices therein emit light of different colors as described above.

In the embodiments of the present disclosure, as shown in FIG. 2, each row of pixel units is controlled by four scanning lines, and at least one scanning line is shared by the row of pixel units and another row of pixel units adjacent to the row of pixel units. In addition, as shown in FIG. 2, each column of pixel units is provided with data voltage signals by a same data line (i.e., by only one data line), that is, all the sub-pixels in each column of pixel units are provided with data voltage signals by the same data line.

In the embodiments of the present disclosure, as shown in FIG. 2, the four scanning lines controlling the sub-pixels (i.e., the first sub-pixels, the second sub-pixels and the third sub-pixels) in an $N^{th}$ row of pixel units are respectively denoted as $G_{1\_N}$, $G_{2\_N}$, $G_{3\_N}$, and $G_{1\_N+1}$, where N is an integer greater than or equal to 2. Gates of the switching transistors M1 of the red sub-pixels of the $N^{th}$ row of pixel units and gates of the sensing transistors M3 of the blue sub-pixels of an $N-1^{th}$ row of pixel units are coupled to the scanning line $G_{1\_N}$, gates of the switching transistors M1 of the green sub-pixels of the $N^{th}$ row of pixel units and gates of the sensing transistors M3 of the red sub-pixels of the $N^{th}$ row of pixel units are coupled to the scanning line $G_{2\_N}$, gates of the switching transistors M1 of the blue sub-pixels of the $N^{th}$ row of pixel units and gates of the sensing transistors M3 of the green sub-pixels of the $N^{th}$ row of pixel units are coupled to the scanning line $G_{3\_N}$, and gates of the sensing transistors M3 of the blue sub-pixels of the $N^{th}$ row of pixel units and gates of the switching transistors M1 of the red sub-pixels of an $N+1^{th}$ row of pixel units are coupled to the scanning line $G_{1\_N+1}$. Each column of pixel units of the plurality of pixel units may be coupled to a same data line. For example, sources (i.e., the first electrodes) of the switching transistors M1 of the sub-pixels (i.e., the red, green and blue sub-pixels) in each column of pixel units are coupled to a same data line (i.e., to only one data line). It is shown that the scanning line $G_{1\_N}$ is shared by the $N^{th}$ and $N-1^{th}$ rows of pixel units, and the scanning line $G_{1\_N+1}$ is shared by the $N^{th}$ and $N+1^{th}$ rows of pixel units.

Furthermore, it can be easily understood that, in the embodiments of the present disclosure, only one scanning line among the four scanning lines controlling the sub-pixels (i.e., the first sub-pixels, the second sub-pixels and the third sub-pixels) in the first row of pixel units is shared by the first row of pixel units and the second row of pixel units, and only one scanning line among the four scanning lines controlling the sub-pixels (i.e., the first sub-pixels, the second sub-pixels and the third sub-pixels) in the last row of pixel units is shared by the last row of pixel units and the penultimate row of pixel units.

In order to understand the array substrate according to the embodiment of the present disclosure more clearly, the driving of a pixel unit in the $N^{th}$ row and first column will be described below with reference to FIGS. 2 and 3 as an example. The pixel unit in the $N^{th}$ row and first column is denoted as a pixel unit $A_{N1}$, and a pixel unit in the $N+1^{th}$ row and first column is denoted as a pixel unit $A_{(N+1)1}$.

Figure 3:
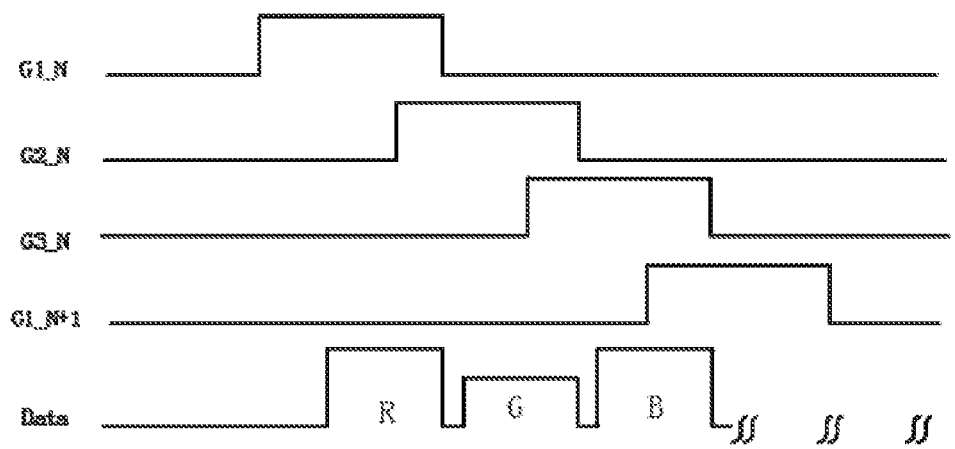
FIG. 3 is a timing diagram of signals for driving a pixel unit in an array substrate according to an embodiment of the present disclosure.

As shown in FIGS. 2 and 3, firstly, a high level signal is applied to the scanning line $G_{1\_N}$, and thus the switching transistor M1 of the red sub-pixel of the pixel unit $A_{N1}$ is turned on, and the storage capacitor Cst and the gate of the driving transistor M2 of the red sub-pixel of the pixel unit $A_{N1}$ are charged (i.e., data is written to the red sub-pixel) through a data voltage signal for the red sub-pixel of the pixel unit $A_{N1}$ applied to a first data line Data1 until the driving transistor M2 of the red sub-pixel of the pixel unit $A_{N1}$ is turned on so as to drive the light-emitting device R in the red sub-pixel of the pixel unit $A_{N1}$ to emit light.

Next, a high level signal is applied to the scanning line $G_{2\_N}$, and the sensing transistor M3 of the red sub-pixel and the switching transistor M1 of the green sub-pixel of the pixel unit $A_{N1}$ are turned on. On this basis, a data voltage signal for writing data to the red sub-pixel of the pixel unit $A_{N1}$ next time can be adjusted by reading an electric potential of a anode of the light-emitting device R in the red sub-pixel of the pixel unit $A_{N1}$ through a sensing line Sense1; meanwhile, the storage capacitor Cst and the gate of the driving transistor M2 of the green sub-pixel of the pixel unit $A_{N1}$ are charged through a data voltage signal for the green sub-pixel of the pixel unit $A_{N1}$ applied to the first data line Data1 until the driving transistor M2 of the green sub-pixel of the pixel unit $A_{N1}$ is turned on so as to drive the light-emitting device G in the green sub-pixel of the pixel unit $A_{N1}$ to emit light. That is, the light-emitting device G in the green sub-pixel of the pixel unit $A_{N1}$ is driven to emit light while the red sub-pixel of the pixel unit $A_{N1}$ is detected.

Next, a high level signal is applied to the scanning line $G_{3\_N}$, and the sensing transistor M3 of the green sub-pixel and the switching transistor M1 of the blue sub-pixel of the pixel unit $A_{N1}$ are turned on. On this basis, a data voltage signal for writing data to the green sub-pixel of the pixel unit $A_{N1}$ next time can be adjusted by reading an electric potential of a anode of the light-emitting device G in the green sub-pixel of the pixel unit $A_{N1}$ through a sensing line Sense2; meanwhile, the storage capacitor Cst and the gate of the driving transistor M2 of the blue sub-pixel of the pixel unit $A_{N1}$ are charged through a data voltage signal for the blue sub-pixel of the pixel unit $A_{N1}$ applied to the first data line Data1 until the driving transistor M2 of the blue sub-pixel of the pixel unit $A_{N1}$ is turned on so as to drive the light-emitting device B in the blue sub-pixel of the pixel unit $A_{N1}$ to emit light. That is, the light-emitting device B in the blue sub-pixel of the pixel unit $A_{N1}$ is driven to emit light while the green sub-pixel of the pixel unit $A_{N1}$ is detected.

Finally, a high level signal is applied to the scanning line $G_{1\_N+1}$, and the sensing transistor M3 of the blue sub-pixel of the pixel unit $A_{N1}$ and the switching transistor M1 of the red sub-pixel of the pixel unit $A_{(N+1)1}$ are turned on. On this basis, a data voltage signal for writing data to the blue sub-pixel of the pixel unit $A_{N1}$ next time can be adjusted by reading an electric potential of a anode of the light-emitting device B in the blue sub-pixel of the pixel unit $A_{N1}$ through the sensing line Sense1; meanwhile, the storage capacitor Cst and the gate of the driving transistor M2 of the red sub-pixel of the pixel unit $A_{(N+1)1}$ are charged through a data voltage signal for the red sub-pixel of the pixel unit $A_{(N+1)1}$ applied to the first data line Data1 until the driving transistor M2 of the red sub-pixel of the pixel unit $A_{(N+1)1}$ is turned on so as to drive the light-emitting device R in the red sub-pixel of the pixel unit $A_{(N+1)1}$ to emit light.

In the embodiments of the present disclosure, it can be seen that although each row of pixel units is controlled by four scanning lines, at least one of the four scanning lines is shared by two adjacent rows of pixel units, and therefore, for the entire array substrate, the number of scanning lines is at most only one more than the case where each row of pixel units is controlled by three scanning lines. On the other hand, in the embodiments of the present disclosure, only one data line is needed for writing data to all the sub-pixels in one column of pixel units, and therefore, the number of data lines is reduced by ⅔ compared to the case where three data lines are needed for writing data to one column of pixel units. Therefore, the array substrate according to the embodiments of the present disclosure can reduce routing space in the array substrate, and improve the resolution of a display panel including the array substrate.

In addition, in order to further reduce the routing space, in some embodiments, sources of the sensing transistors M3 of the green sub-pixels of an $M^{th}$ column of pixel units and sources of the sensing transistors M3 of the red and blue sub-pixels of an M+1$^{th}$ column of pixel units are coupled to a same sensing line, where M is an integer greater than or equal to 1. For example, as shown in FIG. 2, in the $N^{th}$ row, the sources of the sensing transistor M3 of the green sub-pixels of the first column of pixel units and the sources of the sensing transistors M3 of the red and blue sub-pixels of the second column of pixel units are coupled to the sensing line Sense2.

In some embodiments, the light-emitting device in each sub-pixel may include an organic electroluminescence device. In some embodiments, the light-emitting device in each sub-pixel may include a top-emitting organic electroluminescence device. In this case, cathodes of the organic electroluminescence devices in the array substrate can be integral (i.e., one-piece), such that the manufacturing process of the light-emitting devices can be simpler, and the manufacturing cost thereof can be reduced.

An embodiment of the present disclosure also provides a display panel including the above array substrate according to the embodiments of the present disclosure. For example, the display panel may further include a driver that may drive the array substrate to operate according to the timing diagram shown in FIG. 3.

An embodiment of the present disclosure also provides a display device including the above display panel according to the embodiment of the present disclosure. Therefore, the display device including the array substrate according to the embodiments of the present disclosure may achieve high-resolution display. For example, the display device may further include a touch panel disposed on a light emitting surface of the display panel, and the touch panel enables the display device to have a touch function.

In some embodiments, the display device according to an embodiment of the present disclosure may include any product or component with a display function, such as electronic paper, an OLED panel, a mobile phone, a tablet computer, a television, a display, a notebook computer, a digital photo frame, and a navigator.

It will be understood that the above embodiments are exemplary embodiments merely intended to illustrate the principles of the present disclosure, and the present disclosure is not limited thereto. It will be apparent to one of ordinary skill in the art that various changes and modifications can be made therein without departing from the spirit and scope of the present disclosure, and these changes and modifications are also within the protection scope of the present disclosure.

The invention claimed is:

1. An array substrate, comprising a plurality of pixel units arranged in an array,
    each of the plurality of pixel units comprising a first sub-pixel, a second sub-pixel and a third sub-pixel,
    each of the first sub-pixel, the second sub-pixel and the third sub-pixel comprising a pixel circuit which comprises a switching transistor, a driving transistor, a sensing transistor, a storage capacitor and a light-emitting device,
    wherein the first sub-pixels, the second sub-pixels and the third sub-pixels included in each row of pixel units of the plurality of pixel units are controlled by four scanning lines, at least one of the four scanning lines is shared by the row of pixel units and another row of pixel units adjacent to the row of pixel units; and
    each column of pixel units of the plurality of pixel units are coupled to a same data line.

2. The array substrate of claim 1, wherein the first sub-pixels, the second sub-pixels and the third sub-pixels included in an $N^{th}$ row of pixel units of the plurality of pixel units are respectively controlled by scanning lines $G_{1\_N}$, $G_{2\_N}$, $G_{3\_N}$, and $G_{1\_N+1}$, where N is an integer greater than or equal to 2;
    gates of the switching transistors of the first sub-pixels of the $N^{th}$ row of pixel units and gates of the sensing transistors of the third sub-pixels of an N−1$^{th}$ row of pixel units are coupled to the scanning line $G_{1\_N}$;
    gates of the switching transistors of the second sub-pixels of the $N^{th}$ row of pixel units and gates of the sensing transistors of the first sub-pixels of the $N^{th}$ row of pixel units are coupled to the scanning line $G_{2\_N}$;
    gates of the switching transistors of the third sub-pixels of the $N^{th}$ row of pixel units and gates of the sensing transistors of the second sub-pixels of the $N^{th}$ row of pixel units are coupled to the scanning line $G_{3\_N}$; and
    gates of the sensing transistors of the third sub-pixels of the $N^{th}$ row of pixel units and gates of the switching transistors of the first sub-pixels of an N+1$^{th}$ row of pixel units are coupled to the scanning line $G_{1\_N+1}$.

3. The array substrate of claim 2, wherein in each pixel unit, the first and second sub-pixels are located in a same row, and the first and third sub-pixels are located in a same column.

4. The array substrate of claim 3, wherein first electrodes of the sensing transistors of the second sub-pixels of an $M^{th}$ column of pixel units and first electrodes of the sensing transistors of the first and third sub-pixels of an $M+1^{th}$ column of pixel units are coupled to a same sensing line, where M is an integer greater than or equal to 1.

5. The array substrate of claim 2, wherein
first electrodes of the sensing transistors of the first and third sub-pixels of an $M^{th}$ column of pixel units and first electrodes of the sensing transistors of the second sub-pixels of the $M^{th}$ column of pixel units are respectively coupled to two separate sensing lines, where M is an integer greater than or equal to 1; and
in each pixel circuit, a second electrode of the switching transistor is coupled to a gate of the driving transistor and a first terminal of the storage capacitor, a first electrode of the driving transistor is coupled to a first power supply voltage terminal, a second electrode of the driving transistor is coupled to a second terminal of the storage capacitor and a first electrode of the light-emitting device, a second electrode of the sensing transistor is coupled to the second terminal of the storage capacitor and the first electrode of the light-emitting device, and a second electrode of the light-emitting device is coupled to a second power supply voltage terminal.

6. The array substrate of claim 3, wherein
first electrodes of the sensing transistors of the first and third sub-pixels of an $M^{th}$ column of pixel units and first electrodes of the sensing transistors of the second sub-pixels of the $M^{th}$ column of pixel units are respectively coupled to two separate sensing lines, where M is an integer greater than or equal to 1; and
in each pixel circuit, a second electrode of the switching transistor is coupled to a gate of the driving transistor and a first terminal of the storage capacitor, a first electrode of the driving transistor is coupled to a first power supply voltage terminal, a second electrode of the driving transistor is coupled to a second terminal of the storage capacitor and a first electrode of the light-emitting device, a second electrode of the sensing transistor is coupled to the second terminal of the storage capacitor and the first electrode of the light-emitting device, and a second electrode of the light-emitting device is coupled to a second power supply voltage terminal.

7. The array substrate of claim 4, wherein
first electrodes of the sensing transistors of the first and third sub-pixels of the $M^{th}$ column of pixel units and first electrodes of the sensing transistors of the second sub-pixels of the $M^{th}$ column of pixel units are respectively coupled to two separate sensing lines; and
in each pixel circuit, a second electrode of the switching transistor is coupled to a gate of the driving transistor and a first terminal of the storage capacitor, a first electrode of the driving transistor is coupled to a first power supply voltage terminal, a second electrode of the driving transistor is coupled to a second terminal of the storage capacitor and a first electrode of the light-emitting device, a second electrode of the sensing transistor is coupled to the second terminal of the storage capacitor and the first electrode of the light-emitting device, and a second electrode of the light-emitting device is coupled to a second power supply voltage terminal.

8. The array substrate of claim 1, wherein in each pixel unit, the first sub-pixel comprises a light-emitting device emitting red light, the second sub-pixel comprises a light-emitting device emitting green light, and the third sub-pixel comprises a light-emitting device emitting blue light.

9. The array substrate of claim 2, wherein in each pixel unit, the first sub-pixel comprises a light-emitting device emitting red light, the second sub-pixel comprises a light-emitting device emitting green light, and the third sub-pixel comprises a light-emitting device emitting blue light.

10. The array substrate of claim 3, wherein in each pixel unit, the first sub-pixel comprises a light-emitting device emitting red light, the second sub-pixel comprises a light-emitting device emitting green light, and the third sub-pixel comprises a light-emitting device emitting blue light.

11. The array substrate of claim 4, wherein in each pixel unit, the first sub-pixel comprises a light-emitting device emitting red light, the second sub-pixel comprises a light-emitting device emitting green light, and the third sub-pixel comprises a light-emitting device emitting blue light.

12. The array substrate of claim 5, wherein in each pixel unit, the first sub-pixel comprises a light-emitting device emitting red light, the second sub-pixel comprises a light-emitting device emitting green light, and the third sub-pixel comprises a light-emitting device emitting blue light.

13. The array substrate of claim 6, wherein in each pixel unit, the first sub-pixel comprises a light-emitting device emitting red light, the second sub-pixel comprises a light-emitting device emitting green light, and the third sub-pixel comprises a light-emitting device emitting blue light.

14. The array substrate of claim 7, wherein in each pixel unit, the first sub-pixel comprises a light-emitting device emitting red light, the second sub-pixel comprises a light-emitting device emitting green light, and the third sub-pixel comprises a light-emitting device emitting blue light.

15. The array substrate of claim 1, wherein the light-emitting device comprises an organic electroluminescence device.

16. The array substrate of claim 15, wherein the organic electroluminescent device comprises a top-emitting organic electroluminescence device.

17. The array substrate of claim 15, wherein a first electrode of the organic electroluminescence device is an anode, a second electrode of the organic electroluminescence device is a cathode, and the cathodes of all of the organic electroluminescence devices of the array substrate are integral.

18. The array substrate of claim 16, wherein a first electrode of the organic electroluminescence device is an anode, a second electrode of the organic electroluminescence device is a cathode, and the cathodes of all of the organic electroluminescence devices of the array substrate are integral.

19. A display panel, comprising the array substrate of claim 1.

20. A display device, comprising the display panel of claim 19.

* * * * *